(12) United States Patent
Kato et al.

(10) Patent No.: US 10,683,573 B2
(45) Date of Patent: Jun. 16, 2020

(54) FILM FORMING APPARATUS

(71) Applicant: TOKYO ELECTRON LIMITED, Tokyo (JP)

(72) Inventors: Hitoshi Kato, Oshu (JP); Shigehiro Miura, Oshu (JP); Hiroyuki Kikuchi, Oshu (JP); Katsuyoshi Aikawa, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 646 days.

(21) Appl. No.: 14/936,759

(22) Filed: Nov. 10, 2015

(65) Prior Publication Data
US 2016/0138159 A1 May 19, 2016

(30) Foreign Application Priority Data
Nov. 13, 2014 (JP) .................. 2014-230907

(51) Int. Cl.
*C23C 16/458* (2006.01)
*H01L 21/687* (2006.01)
(Continued)

(52) U.S. Cl.
CPC ...... *C23C 16/4584* (2013.01); *C23C 16/4408* (2013.01); *C23C 16/45551* (2013.01);
(Continued)

(58) Field of Classification Search
CPC .......... C23C 16/4584; C23C 16/45551; C23C 16/45548; H01L 21/68764;
(Continued)

(56) References Cited

U.S. PATENT DOCUMENTS 4,284,033 A * 8/1981 del Rio .................. C23C 14/505
118/730
5,795,448 A * 8/1998 Hurwitt ............... H01L 21/6715
118/729
(Continued)

FOREIGN PATENT DOCUMENTS

CN 102934220 A 2/2013
JP 4-302138 A 10/1992
(Continued)

*Primary Examiner* — Parviz Hassanzadeh
*Assistant Examiner* — Margaret D Klunk
(74) *Attorney, Agent, or Firm* — Nath, Goldberg & Meyer; Jerald L. Meyer

(57) ABSTRACT

A film forming apparatus of forming a film by supplying a process gas onto a substrate includes a rotation table having a loading region and is configured to revolve the substrate loaded on the loading region; a process gas supply mechanism configured to supply the process gas to a gas supply region to perform film formation on the substrate repeatedly passing through the gas supply region a plurality of times by revolution of the substrate; a first gear disposed on the other surface side of the rotation table and rotated in a rotation direction of the rotation table; a second gear configured with planetary gears engaging with the first gear, disposed to be revolved together with the loading region, and configured to rotate the loading region so as to allow the substrate to be rotated.

3 Claims, 18 Drawing Sheets

(51) Int. Cl.
*C23C 16/44* (2006.01)
*C23C 16/455* (2006.01)

(52) U.S. Cl.
CPC .. *H01L 21/68764* (2013.01); *H01L 21/68771* (2013.01); *H01L 21/68792* (2013.01)

(58) Field of Classification Search
CPC ......... H01L 21/68771; H01L 21/68792; F16H 1/28; F16H 3/666; F16H 37/046; F16H 37/082; F16H 48/11; F16H 57/082
See application file for complete search history.

(56) References Cited

U.S. PATENT DOCUMENTS

2010/0227059 A1* 9/2010 Kato ................ C23C 16/45551
427/255.28
2011/0300297 A1* 12/2011 Celaru ................ C23C 16/4584
427/255.5

FOREIGN PATENT DOCUMENTS

| | | |
|---|---|---|
| JP | 2001-254181 A | 9/2001 |
| JP | 2009-194045 A | 8/2009 |
| JP | 4817210 B2 | 11/2011 |
| KR | 20090059599 A * | 6/2009 |

* cited by examiner

Evaluation test 1-1

Evaluation test 1-2

Evaluation test 1-3

Evaluation test 1-4

FILM FORMING APPARATUS

CROSS-REFERENCE TO RELATED APPLICATION

This application claims the benefit of Japanese Patent Application No. 2014-230907, filed on Nov. 13, 2014, in the Japan Patent Office, the disclosure of which is incorporated herein in its entirety by reference.

TECHNICAL FIELD

The present disclosure relates to a film forming apparatus that forms a film by supplying a process gas to a substrate.

BACKGROUND

As a film forming apparatus for forming a thin film such as silicon oxide ($SiO_2$) on a substrate such as a semiconductor wafer (hereinafter, referred to as a wafer), for example, a film forming apparatus for performing atomic layer deposition (ALD) has been known. As an example of this type of the film forming apparatus, there is an apparatus including a process chamber whose inside is kept in a vacuum atmosphere and in which a rotation table allowing, for example, a wafer to be loaded thereon is disposed. Above the rotation table, a gas nozzle discharging a source gas which is a raw material of, for example, a silicon oxide film, and a gas nozzle discharging an oxidation gas oxidizing the source gas are disposed. In addition, while the wafer is revolved by the rotation of the rotation table, the wafer alternately passes through an adsorption region to which the source gas is supplied and an oxidation region to which the oxidation gas is applied, thereby forming a silicon oxide film.

In ALD, in order to control the distribution of in-plane film thickness of the wafer, distribution of the source gas adsorbed onto the wafer needs to be controlled. Thus, in such a film forming apparatus, the number and locations of discharge holes formed in the gas nozzle for the source gas are suitably adjusted. In addition, selection of shapes of the gas nozzles, a regulation of a supply amount of a separation gas supplied for separating the adsorption region and the oxidation region, adjustment of concentration of a carrier gas in the source gas, and the like are suitably performed.

In a certain case, an etching rate for each of a peripheral portion and a center portion of the wafer can be adjusted by etching after a film formation process. In this case, since film thicknesses at the peripheral portion and the center portion can be aligned after the etching, a highly uniform film thickness is required particularly in a circumferential direction of the wafer. However, due to revolution of the wafer, each portion of the wafer is repeatedly moved along the same orbit separated from a rotation center of the rotation table by a predetermined distance. Thus, there can be concerns that a deviation in distribution of the source gas in an adsorption region can cause a deviation in film thickness on the wafer along a radial direction of the rotation table, and that the deviation in film thickness would not be sufficiently solved through adjustment of the discharge holes and the like as set forth above.

In the related art, a plurality of loading regions of wafers are formed on the rotation table, and the revolving wafers are rotated by a plurality of rotation devices disposed on the respective loading regions. However, installation of the plural rotation devices causes an increase in manufacturing costs of the apparatus.

SUMMARY

Some embodiments of the present disclosure provide a film forming apparatus which can suppress increase in manufacturing cost of a film forming apparatus while improving uniformity of in-plane film thickness of a substrate in a circumferential direction of the substrate when performing film formation by revolving the substrate loaded on a rotation table.

According to an embodiment of the present disclosure, there is provided a film forming apparatus that forms a film by supplying a process gas onto a substrate, including: a rotation table disposed in a vacuum chamber and having a loading region formed on one surface side of the rotation table, the rotation table being configured to revolve the substrate loaded on the loading region; a process gas supply mechanism configured to supply the process gas to a gas supply region on the one surface side of the rotation table to thereby perform film formation on the substrate repeatedly passing through the gas supply region a plurality of times by revolution of the substrate; a first gear disposed on the other surface side of the rotation table and rotated in a rotation direction of the rotation table; a second gear configured with planetary gears engaging with the first gear, the planetary gears being disposed to be revolved together with the loading region and configured to rotate the loading region so as to allow the substrate to be rotated; and a rotation driving part configured to rotate the first gear to adjust a rotation speed of the substrate. The film forming apparatus further includes: a rotation shaft on which the planetary gear is disposed, the rotation shaft configured to rotate the loading region; a bearing configured to support the rotation shaft; and a support member supporting the bearing at the rotation table. The support member includes a support disposed to be separated from the rotation shaft in the rotation direction of the rotation table, and a connection part disposed to be separated from the lower surface side of the rotation table and connected to the support and the bearing. At an upper side of the connection part, heaters configured to heat the substrate are disposed at each of inner and outer sides of a moving path of the rotation shaft and the support, respectively.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

According to an embodiment of the present disclosure, a film forming apparatus 1 performing ALD on a wafer W corresponding to a substrate will be described in detail. The film forming apparatus 1 is configured to adsorb bis(tertiary-butyl-amino)silane (BTBAS) gas as a source gas, which is a process gas containing silicon (Si), onto the wafer W, to form a molecular layer of silicon oxide ($SiO_2$) by supplying ozone ($O_3$) gas which is an oxidation gas oxidizing the adsorbed BTBAS gas, and to expose the molecular layer to plasma generated from a plasma generation gas in order to reform the molecular layer. It is configured that this series of processes is repeatedly performed a plurality of times, thereby forming a $SiO_2$ film.

Figure 1:
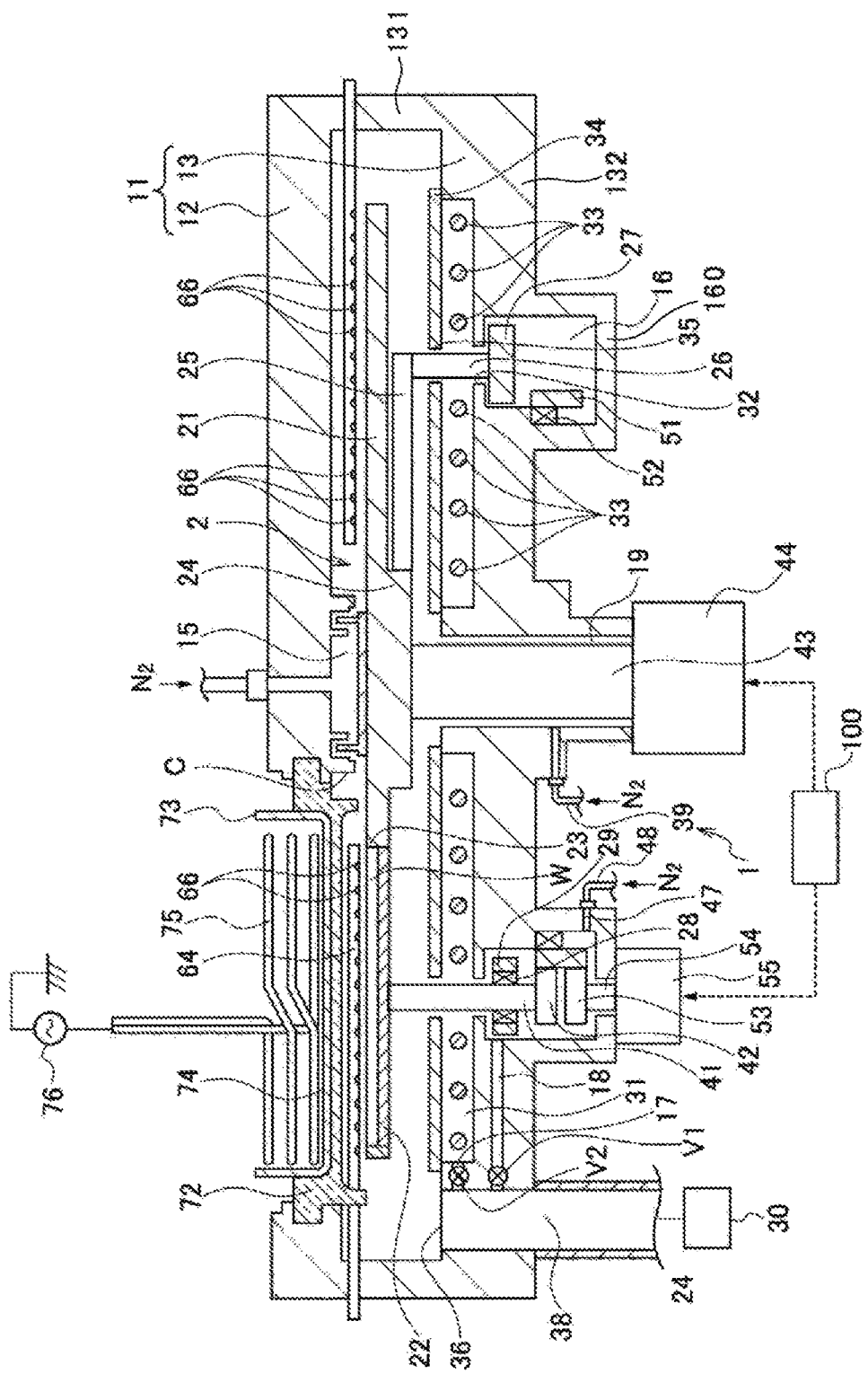
FIG. 1 is a longitudinal sectional view of a film forming apparatus according to an embodiment of the present disclosure.
Figure 2:
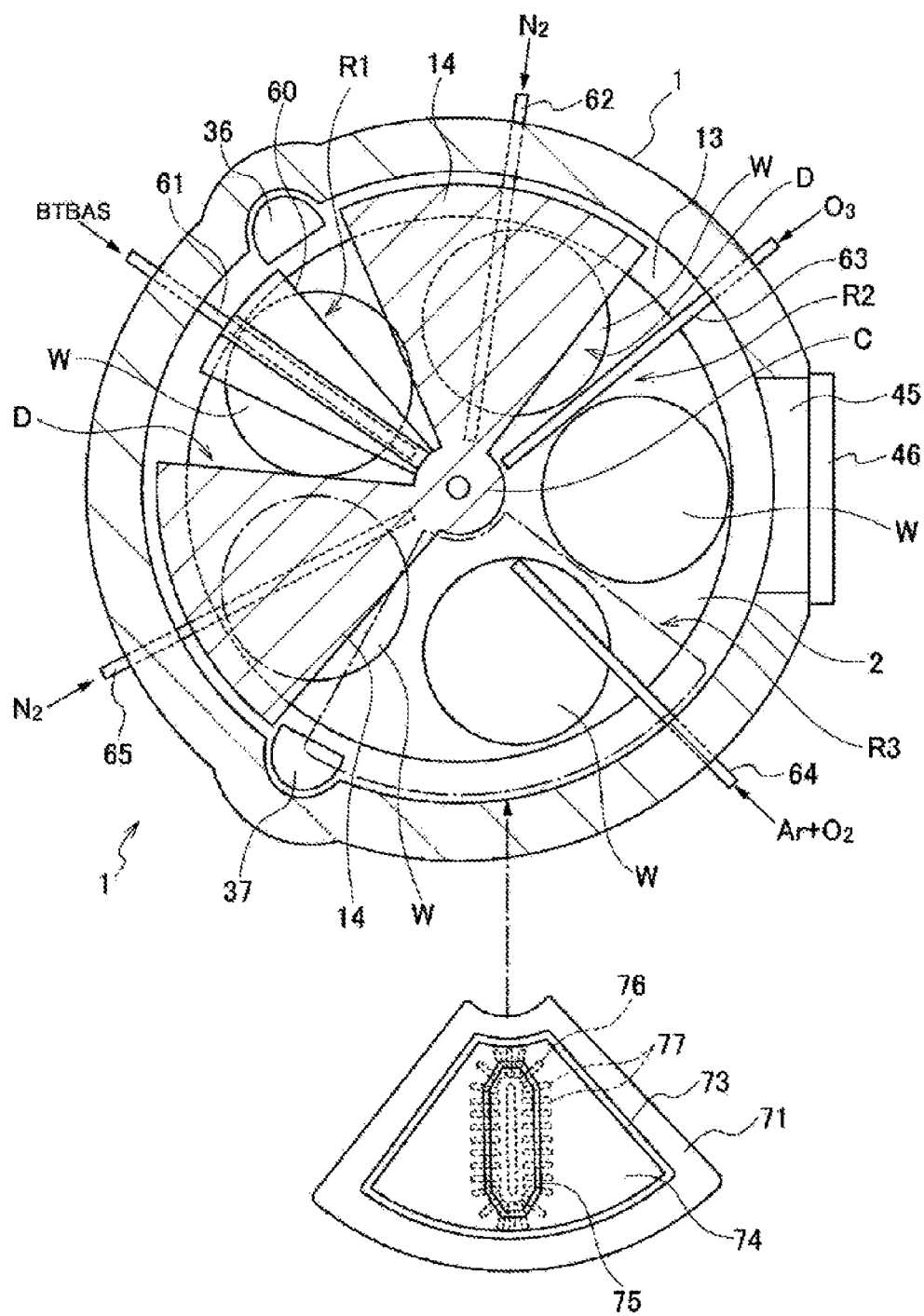
FIG. 2 is a horizontal plane view of the film forming apparatus.
Figure 3:
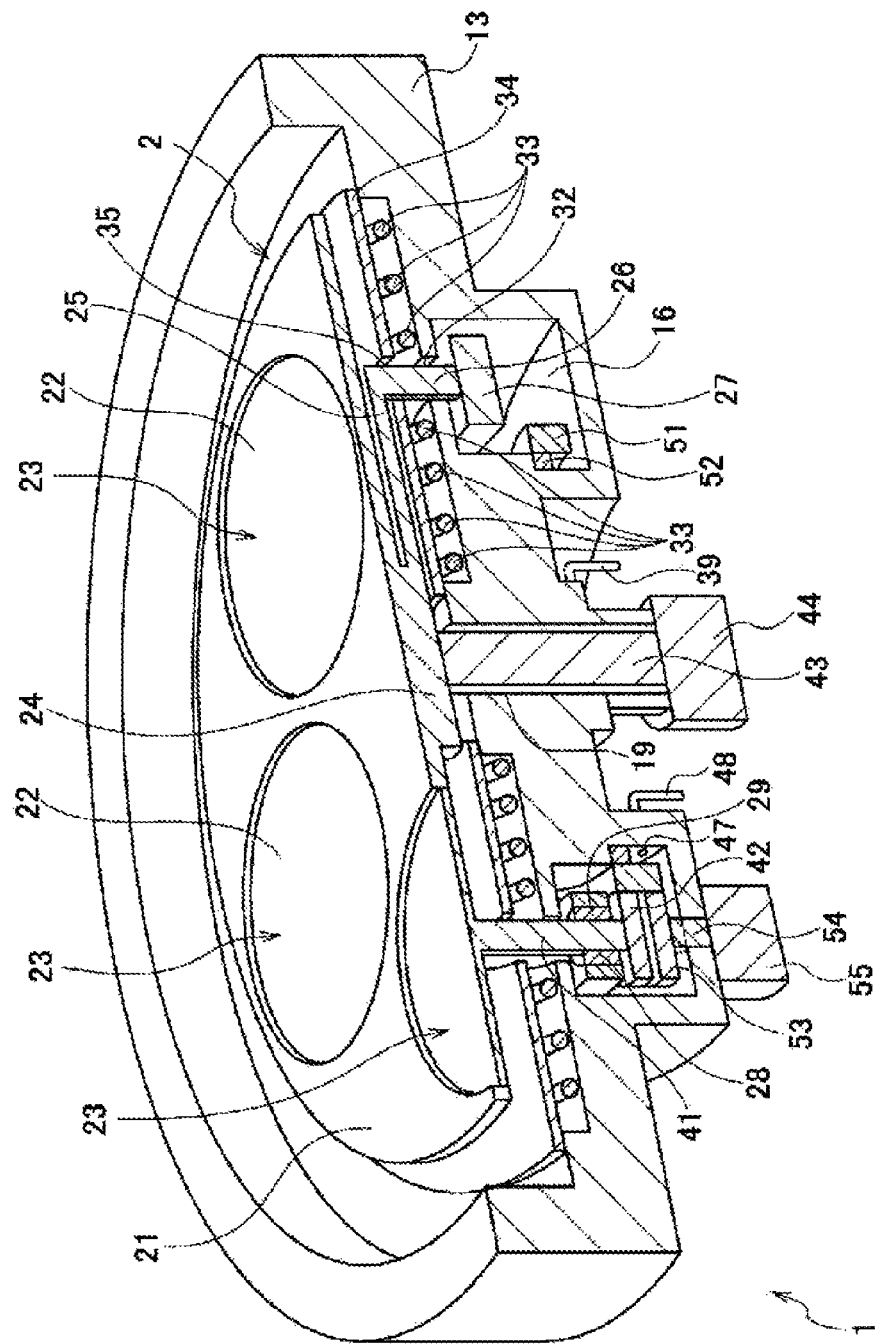
FIG. 3 is a longitudinally sectional perspective view of the film forming apparatus.

FIGS. 1, 2 and 3 are a longitudinal sectional view, a plane view and a longitudinally sectional perspective view of the film forming apparatus 1, respectively.

The film forming apparatus 1 includes a flat vacuum chamber (process chamber) 11 of a substantially circular shape and a horizontal rotation table (susceptor) 2 of a substantially circular disc shape which is disposed in the vacuum chamber 11 and rotated in a circumferential direction thereof. The vacuum chamber 11 includes a ceiling plate 12, and a chamber body 13 constituting a sidewall 131 and a lower side (bottom wall 132) of the vacuum chamber 11.

In addition, a center region forming portion C, which has a circular shape in a plan view and protrudes so as to face a center portion of the rotation table 2, and protrusions 14 each having a fan shape in a plan view formed to increasingly widen from the center region forming portion C toward an outer side of the rotation table 2, are formed in a lower side of the ceiling plate 12 in the vacuum chamber 11. That is, the center region forming portion C and the protrusions 14 constitute a lower ceiling plane than their outer regions. A gap between the center region forming portion C and the center portion of the rotation table 2 forms a flow path 15 for $N_2$ gas. During processing of the wafer W, the $N_2$ gas is supplied to the flow path 15 from a gas supply tube connected to the ceiling plate 12, and discharged from the flow path 15 toward an overall outer circumferential side of the rotation table 2. The $N_2$ gas prevents the source gas and the oxidation gas from being brought into contact with each other over the center portion of the rotation table 2.

Figure 4:
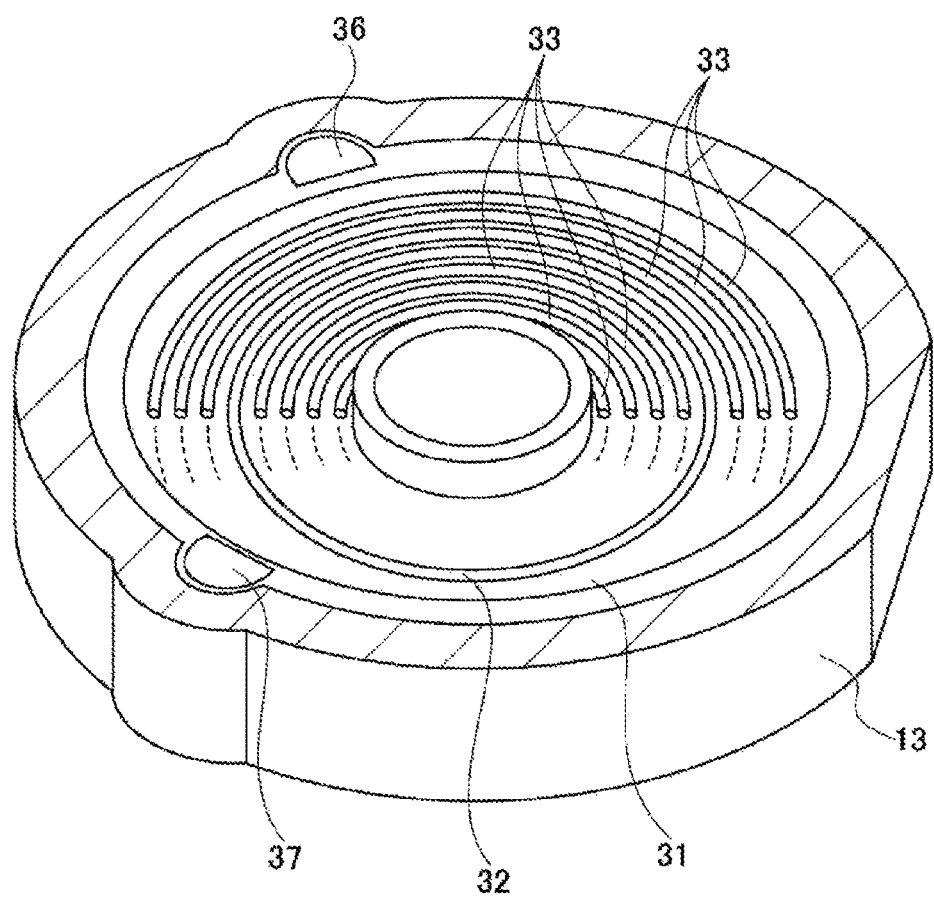
FIG. 4 is a perspective view showing an inside of the film forming apparatus.

FIG. 4 is a perspective view showing a bottom of an inside of the chamber body 13. A recess portion 31 having a flat ring shape is formed in the chamber body 13 below the rotation table 2 along the circumference of the rotation table 2. In addition, a ring-shaped slit 32 is opened on a lower side of the recess portion 31 along a circumferential direction of the recess portion 31. In addition, heaters 33 for heating the wafer W loaded on the rotation table 2 are disposed in a form of seven rings on the lower side of the recess portion 31. In FIG. 4, the heaters 33 are shown as being partially cut out for the sake of simplicity.

The heaters 33 are disposed along concentric circles centered at a rotation center of the rotation table 2. In addition, four of the seven heaters 33 are disposed at an inner side of the slit 32 and the other three heaters are disposed at an outer side of the slit 32. Further, a shield 34 is disposed to cover an upper side of each of the heaters 33 and to shield an upper side of the recess portion 31 (see FIGS. 1 and 3). A ring-shaped slit 35 is formed in the shield 34 to be overlapped with the slit 32. Exhaust holes 36 and 37 for evacuating the vacuum chamber 11 are opened at an outer side of the recess portion 31 in the bottom of the chamber body 13. Each of the exhaust holes 36 and 37 is connected to an exhaust mechanism 30 including a vacuum pump through an exhaust path 38 disposed in the chamber body 13.

In addition, an annular ring protrusion 160 having a U-shaped cross section is formed to protrude downward from a lower surface of the bottom wall 132. Inside the protrusion 160, a ring-shaped space 16 is formed under the recess portion 31 along a rotation direction of the rotation table 2 and is communicated with the recess portion 31 through the slit 32. The ring-shaped space 16 in the recess portion 31 is connected to the exhaust path 38 at a downstream side of the exhaust hole 36 through each of flow paths 17 and 18 (see FIG. 1). Reference symbols V1 and V2 refer to valves disposed in the flow paths 17 and 18, respectively, and the valves are suitably opened when processing the wafer W. In addition, the ring-shaped space 16 in the recess portion 31 is evacuated by the exhaust mechanism 30. Although the illustration is omitted, for example, the exhaust path 38 at a downstream side of the exhaust hole 37 is also connected to the ring-shaped space 16 in the recess portion 31 through the flow paths 17 and 18, which include the valves, respectively, like the exhaust path 38 at the downstream side of the exhaust hole 36. Reference numeral 47 in FIGS. 1 and 3 refers to a gas supply path opened to the ring-shaped space 16. Reference numeral 48 in the figures refers to a gas nozzle for supplying, for example, the $N_2$ gas to the ring-shaped space 16 through the gas supply path 47 during processing of the wafer W and for purging the ring-shaped space 16.

Figure 5:
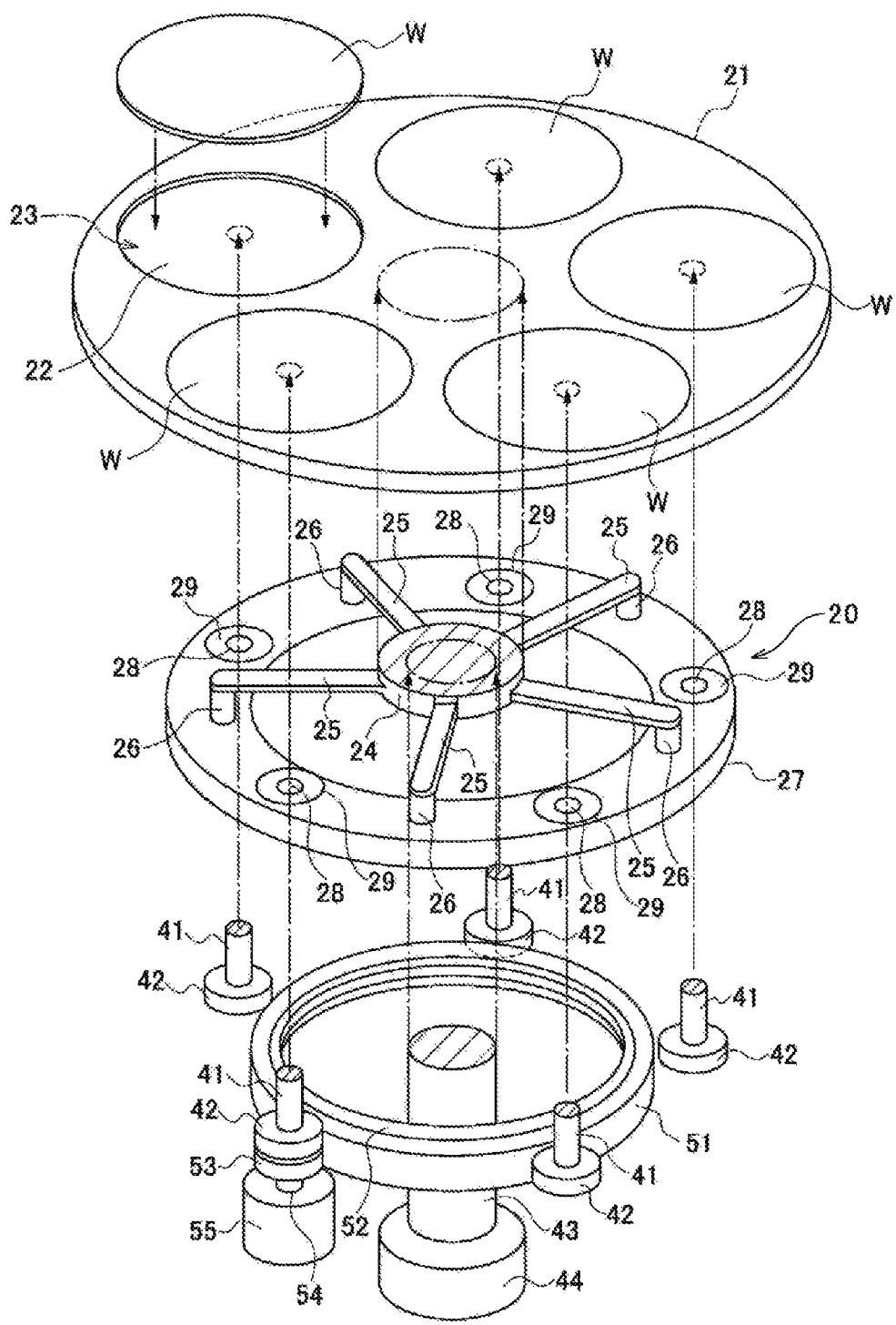
FIG. 5 is an exploded perspective view showing an upper side of a rotation table of the film forming apparatus.
Figure 6:
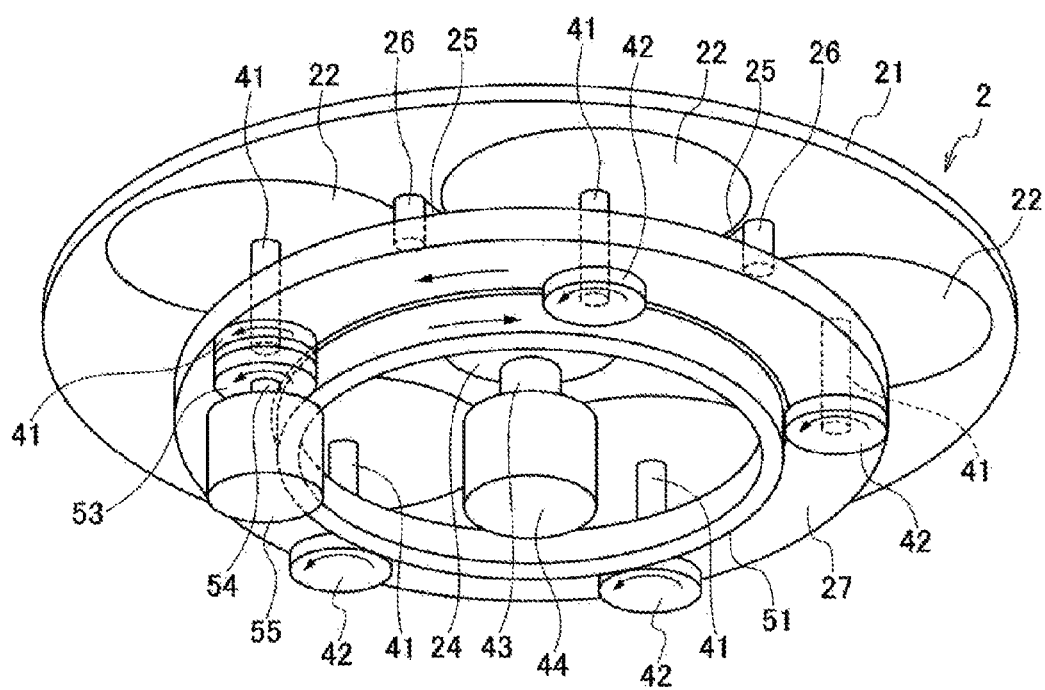
FIG. 6 is a perspective view of a lower side of the rotation table.

Next, the rotation table 2 will be described in detail with reference to FIG. 5, which is an exploded perspective view showing each of the parts of a front side (one side) of the rotation table 2, and FIG. 6, which is a perspective view of a rear side (the other side) of the rotation table 2. The rotation table 2 includes a horizontal circular table body 21, and the table body 21 is provided with five circular through-holes which pass through the table body 21 in a thickness direction thereof and are disposed at intervals in a circumferential direction thereof. In addition, a circular loading portion 22 forming a loading region of the wafer W is disposed so as to block up the through-holes from the rear side of the table body 21, and a recess portion 23 is formed by the loading portion 22 and a sidewall of the through-hole. The wafer W is received in the recess portion 23.

A circular part 24 is formed at a center portion of the rear side of the table body 21 and protrudes downwards, and, for example, five support arms 25 radially extend from the circular part 24. A support 26 extends downwards from a front end of each of the support arms 25, and a lower end of the support 26 enters the ring-shaped space 16 of the chamber body 13 through the slits 35 and 32 (see FIGS. 1 and 3) and is connected to an upper surface of a flat ring member 27 (connection part) disposed in the ring-shaped space 16. The circular part 24, the support arm 25, the support 26 and the flat ring member 27 constitute a support member 20 (see FIG. 5).

The ring member 27 is formed in the rotation direction of the rotation table 2, and is provided with through-holes 28, which pass through the ring member 27 in the vertical direction and are arranged at intervals in the circumferential direction of the ring member 27. In addition, a rotation shaft 41 for rotating a wafer W extends vertically downwards from a center portion of a lower surface of each of the loading portions 22, and a lower end of each of the rotation shafts 41 enters the ring-shaped space 16 through the slits 35 and 32 and passes through the through-hole 28 to be connected to a planetary gear 42 constituting a second gear. The rotation shaft 41 is rotated around its axis by rotation of the planetary gear 42, and a bearing 29, which laterally surrounds and supports the rotation shaft 41, is disposed in each of the through-holes 28.

Further, a center shaft 43 extends vertically downwards from a center portion of the circular part 24 and is connected to a revolution driver 44, which is installed to block up an opening 19 opened at the lower side of the chamber body 13. The revolution driver 44 includes a motor and rotates the rotation table 2, for example, clockwise in a plan view while supporting the rotation table 2 via the center shaft 43. Reference numeral 39 in FIGS. 1 and 3 refers to a gas nozzle for discharging the $N_2$ (nitrogen) gas to a gap between the center shaft 43 and the chamber body 13, and the gas nozzle serves to discharge the $N_2$ gas during processing of the wafer W to prevent the source gas and the oxidation gas from flowing from the front side to the rear side of the rotation table 2.

For more details of the ring-shaped space 16 formed at the lower side of the chamber body 13, a first gear 51, which has a ring shape and is a sun gear, is formed in the ring-shaped space 16 along the rotation direction of the rotation table 2. The first gear 51 is configured to be rotated in the circumferential direction thereof via a bearing 52 installed at an inner circumference thereof, and has an outer circumference engaging with the planetary gears 42. In FIG. 6, the indication of the bearing 52 is omitted for simplicity. In addition, a driving gear 53 is disposed in the ring-shaped space 16 to be engaged with the outer circumference of the first gear 51. The driving gear 53 is connected to a rotation driver 55 disposed outside the ring-shaped space 16 through a vertically disposed rotation shaft 54. The rotation driver 55 includes a motor similar to the revolution driver 44, and an operator of the film forming apparatus 1 can rotate the driving gear 53 at a desired rotation speed through a controller 100 described below.

Figure 7:
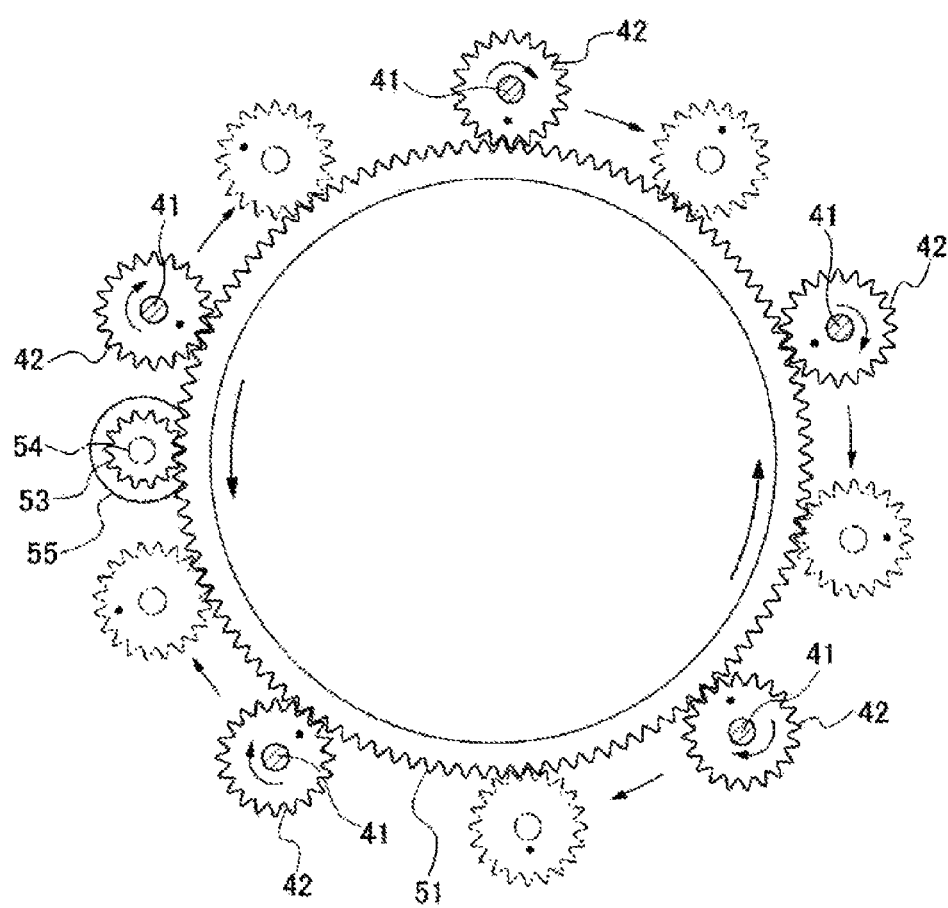
FIG. 7 is a diagram showing rotary motion of each gear.

With the structure as described above, the film forming apparatus 1 allows rotation and revolution of the wafer W to be simultaneously performed during processing of the wafer W. With reference to FIG. 7 showing motion of each of the gears, rotation and revolution of the wafer W will be described in detail. Except FIG. 7, teeth of the gears are omitted in the other figures.

If the rotation table 2 is rotated by the revolution driver 44, for example, in a clockwise direction in a plan view and the wafer W loaded on the rotation table 2 is revolved around the center axis of the rotation table 2, the ring member 27 connected to the rotation table 2 is rotated around the center axis of the rotation table 2, whereby the rotation shaft 41 and the planetary gears 42, which are supported by the ring member 27, are also rotated around the center axis. That is, the rotation shaft 41 and the planetary gears 42 are revolved together with the wafer W. While the rotation table 2 is rotated, the driving gear 53 is rotated by the rotation driver 55, and the first gear 51 corresponding to a sun gear is rotated, for example, in the counterclockwise direction from a plan view. The planetary gears 42 are rotated in the clockwise direction from a plan view due to revolution as set forth above and rotation of the first gear 51, and the loading portion 22 of the rotation table 2, which is connected to the planetary gears 42 through the rotation shaft 41, is rotated. Thus, the wafer W is rotated in the clockwise direction from a plan view. As such, since the wafer W is rotated due to rotation of the first gear 51, a rotation speed of the wafer W is controlled by a rotation speed of the driving gear 53 by the rotation driver 55. That is, the rotation speed of the wafer W may be adjusted independently from a revolution speed of the wafer W.

The rotation speed of the wafer W is set such that rotation of the wafer W is not synchronized with a revolution thereof. Synchronization of rotation and revolution means that the wafer W is revolved an integer number of times while rotated once. That is, the first gear 51 is rotated to be a rotation speed allowing the wafer W to face a different direction whenever revolved once. This serves to align an amount of the adsorbed source gas in the circumferential direction of the wafer W and to form a film to have a highly uniform thickness in the circumferential direction by rotating the wafer W such that a direction of the wafer W is changed whenever the wafer W is placed in an adsorption region R1 of the source gas, even though distribution of the source gas in the adsorption region R1 is changed.

In addition, if the rotation speed of the wafer W is high, since the direction of the wafer W is greatly changed when the wafer W passes through the adsorption region R1, biased adsorption of the source gas in the circumferential direction of the wafer W can be suppressed, and uniformity of film thickness in the circumferential direction can be improved. However, if the rotation speed of the wafer W is too high, since the wafer W is levitated and deviated from the rotation table 2 due to centrifugal force, rotation of the first gear 51 is controlled such that the rotation speed of the wafer W is, for example, 10 rpm or less.

Referring to FIGS. 1 and 2 again, each of the other parts of the film forming apparatus 1 will be described in detail. A transfer port 45 of the wafer W and a gate valve 46 for opening and closing the transfer port 45 are provided in a sidewall of the chamber body 13 (see FIG. 2), and the wafer W is delivered between a transfer device entering the vacuum chamber 11 and the recess portion 23 of the rotation table 2 through the transfer port 45. Specifically, through-holes are formed at respective locations in the bottom of the chamber body 13, which correspond to the loading portions 22 constituting the recess portion 23, and a front end of a pin is moved up and down between the loading portion 22 and the lower portion of the chamber body 13 through each of the through-holes. The delivery of the wafer W is performed by the pin. The pin and the through-hole of each of the portions through which the pin penetrates are omitted in the figures.

In addition, as shown in FIG. 2, a source gas nozzle 61, a separation gas nozzle 62, an oxidation gas nozzle 63, a plasma generation gas nozzle 64, and a separation gas nozzle 65 are disposed over the rotation table 2 in this order at intervals in the rotation direction of the rotation table 2. Each of the gas nozzles 61 to 65 is formed in a rod shape horizontally extending along the radial direction of the rotation table 2 from the sidewall toward the center of the vacuum chamber 11, and discharges a gas downwards from a plurality of discharge holes 66 formed along the radial direction.

The source gas nozzle 61 included in a process gas supply device discharges bis(tertiary-butyl-amino)silane (BTBAS) gas as set forth above. Reference numeral 60 in FIG. 2 refers to a nozzle cover covering the source gas nozzle 61, and the nozzle cover 60 is formed in a fan shape widening from the source gas nozzle 61 toward upstream and downstream sides of the rotation direction of the rotation table 2. The nozzle cover 60 serves to improve adsorption of the BTBAS gas onto the wafer W by increasing the concentration of BTBAS gas under the nozzle cover 60. In addition, the oxidation gas nozzle 63 discharges the ozone gas as set forth above. The separation gas nozzles 62 and 65 are gas nozzles for discharging the $N_2$ gas, and are disposed to divide the fan-shaped protrusions 14 of the ceiling plate 12 in a circumferential direction.

The plasma generation gas nozzle 64 discharges a plasma generation gas including a mixture of argon (Ar) gas and oxygen ($O_2$) gas. A fan-shaped opening extending in the rotation direction of the rotation table 2 is formed in the ceiling plate 12, and a cup-shaped plasma forming part 71, which corresponds to a shape of the opening and is made of a dielectric such as quartz and the like, is provided to block the opening. The plasma forming part 71 is disposed between the oxidation gas nozzle 63 and the protrusion 14 in the rotation direction of the rotation table 2. In FIG. 2, a location in which the plasma forming part 71 is disposed is indicated by a dot-and-dash line.

A protrusion 72 is formed on a lower side of the plasma forming part 71 along a peripheral portion of the plasma forming part 71, and a front end of the plasma generation gas nozzle 64 passes through the protrusion 72 from the outer circumferential side of the rotation table 2 so as to discharge a gas to a region surrounded by the protrusion 72. The protrusion 72 serves to suppress $N_2$ gas, ozone gas and BTBAS gas from flowing into a lower side of the plasma forming part 71 and to suppress decrease in concentration of a plasma generation gas.

A recess portion is formed on an upper side of the plasma forming part 71, and a Faraday shield 73 of an open-top box shape is disposed in the recess portion. An antenna 75 obtained by winding a metal wire in a coil shape around a vertical axis is disposed on a lower side of the faraday shield 73 via a plate member 74 for insulation, and a radio-frequency power supply 76 is connected to the antenna 75. On the lower side of the Faraday shield 73, a slit 77 for preventing an electric field component of an electromagnetic field, which is generated in the antenna 75 upon applying a radio frequency to the antenna 75, from heading downward and for allowing a magnetic field component to head downwards is formed. The slit 77 extends in a direction orthogonal to (interesting with) a winding direction of the antenna 75, and a plurality of the slits 77 is formed along the winding direction of the antenna 75. With the structure of the components as described above, when radio frequency is applied to the antenna 75 by turning on the radio-frequency power supply 76, plasma is generated from the plasma generation gas supplied to a lower side of the plasma forming part 71.

Above the rotation table 2, a lower region of the nozzle cover 60 of the source gas nozzle 61 is defined as the adsorption region R1 to which BTBAS gas corresponding to the source gas is supplied, and a lower region of the oxidation gas nozzle 63 is defined as an oxidation region R2 in which the BTABS gas is oxidized by the ozone gas. In addition, a lower region of the plasma forming part 71 is defined as a plasma forming region R3 in which a $SiO_2$ film is reformed by plasma. Lower regions of the protrusions 14 define separation regions D for preventing the source gas and the oxidation gas from being mixed by allowing the adsorption region R1 and the oxidation region R2 to be separated from each other by the $N_2$ gas discharged from the separation gas nozzles 62 and 65, respectively.

The exhaust hole 36 is opened at a radially outer side between the adsorption region R1 and the division region D near a downstream side of the adsorption region R1 in the rotation direction of the rotation table 2, and a surplus of the BTBAS gas is exhausted through the exhaust hole 36. The exhaust hole 37 is opened at a radially outer side in the vicinity of a boundary region between the plasma forming region R3 and the division region D near a downstream side of the plasma forming region R3 in the rotation direction of the rotation table 2, and surplus $O_3$ and plasma generation gas are exhausted through the exhaust hole 37. The $N_2$ gases supplied from each of the division regions D, the gas supply tube 39 and the center region forming portion C of the rotation table 2 is also exhausted through each of the exhaust holes 36 and 37.

The film forming apparatus 1 includes the controller 100 implemented by a computer for controlling operations of the overall apparatus (see FIG. 1). A program for performing processes of forming a film described below is stored in the controller 100. The program controls an operation of each of the components of the film forming apparatus 1 by sending control signals to each of the components. Specifically, a supply amount of the gas supplied from each of the gas nozzles 61 to 66, a temperature of the wafer W by the heater 33, supply amounts of $N_2$ gases supplied from the gas supply tube 39 and the center region forming portion C, the rotation speed of the rotation table 2 by the revolution driver 44, the rotation speed of the wafer W by the rotation driver 55, an exhaust flow rate from the exhaust holes 36 and 37, and the like are controlled according to the control signals. In the program, a group of steps is programmed to conduct these controls and perform each of the processes described below. The program is installed in the controller 100 from a storage medium such as hard disks, compact discs, magneto-optical discs, memory cards, flexible disks, or the like.

A film forming process by the film forming apparatus will be described below. The wafer W is loaded in each of the recess portions 23 by the transfer device not shown (see FIG. 8). Next, with reference to FIGS. 8 to 11 schematically showing the wafer W loaded in the rotation table 2, appropriate explanations will be given. In FIGS. 8 to 11, the wafers W are denoted by W1 to W5 for clarity, respectively. In addition, to indicate an orientation of the wafer W that is changed during the film forming process, diameters of the wafers W1 to W5 that are not subjected to the film forming process are represented by arrows A1 to A5 pointing towards the center of the rotation table 2, respectively, in a region corresponding to the diameter of the rotation table 2.

After the wafers W1 to W5 are loaded, the gate valve is closed, the vacuum chamber 11 is evacuated to be a vacuum atmosphere at a certain pressure via the exhaust holes 36 and 37, and $N_2$ gas is supplied from the separation gas nozzles 62 and 65 to the rotation table 2. In addition, the $N_2$ gas is supplied from the center region forming portion C of the rotation table 2 and the gas supply tube 39 at the lower side of the rotation table 2 as a purge gas, and flows from the center portion to the peripheral portion of the rotation table 2. Further, a temperature of the heater 33 increases, the rotation table 2 is heated by radiant heat from the heater 33, and each of the wafers W1 to W5 is heated to a certain temperature by heat transferred from the rotation table 2.

Figure 9:
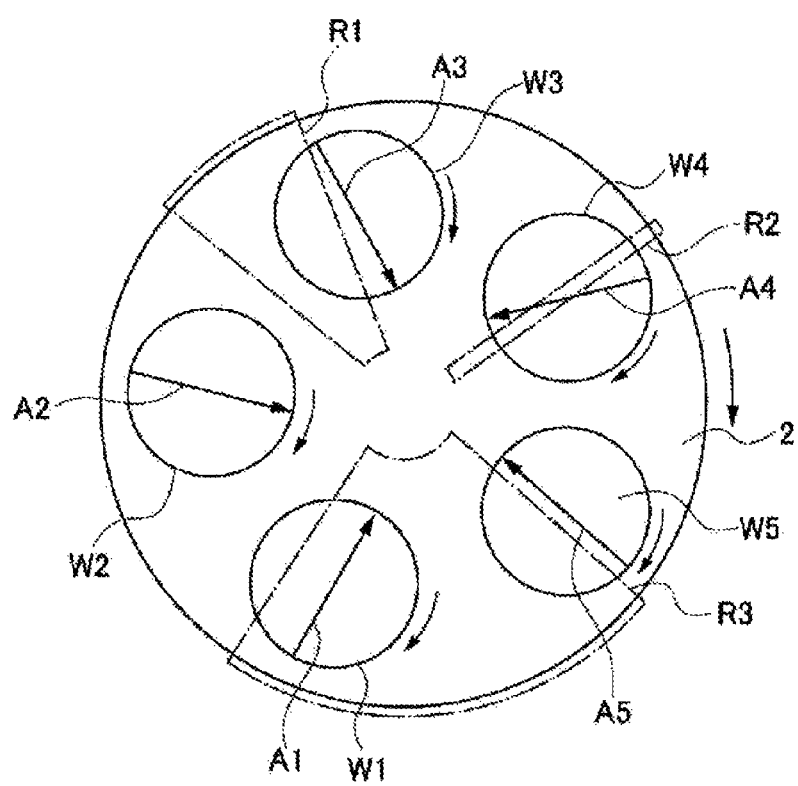

Next, both rotation of the rotation table 2 by the revolution driver 44 and rotation of the loading portion 22 by the rotation driver 55 are started. That is, the revolution and the rotation of the wafer W are started. For example, as soon as the revolution and the rotation of the wafer W are started, the gases are supplied from the source gas nozzle 61, the oxidation gas nozzle 63 and the plasma generation gas nozzle 64, respectively, and a radio frequency is applied to the antenna 75 from the radio-frequency power supply 76, thereby starting to generate plasma. FIG. 9 shows that after a certain period of time elapses since the film formation process is started, the rotation table 2 is rotated 180 degrees from the start of film formation, and the orientation of the wafer W is changed by the rotation.

Figure 12:
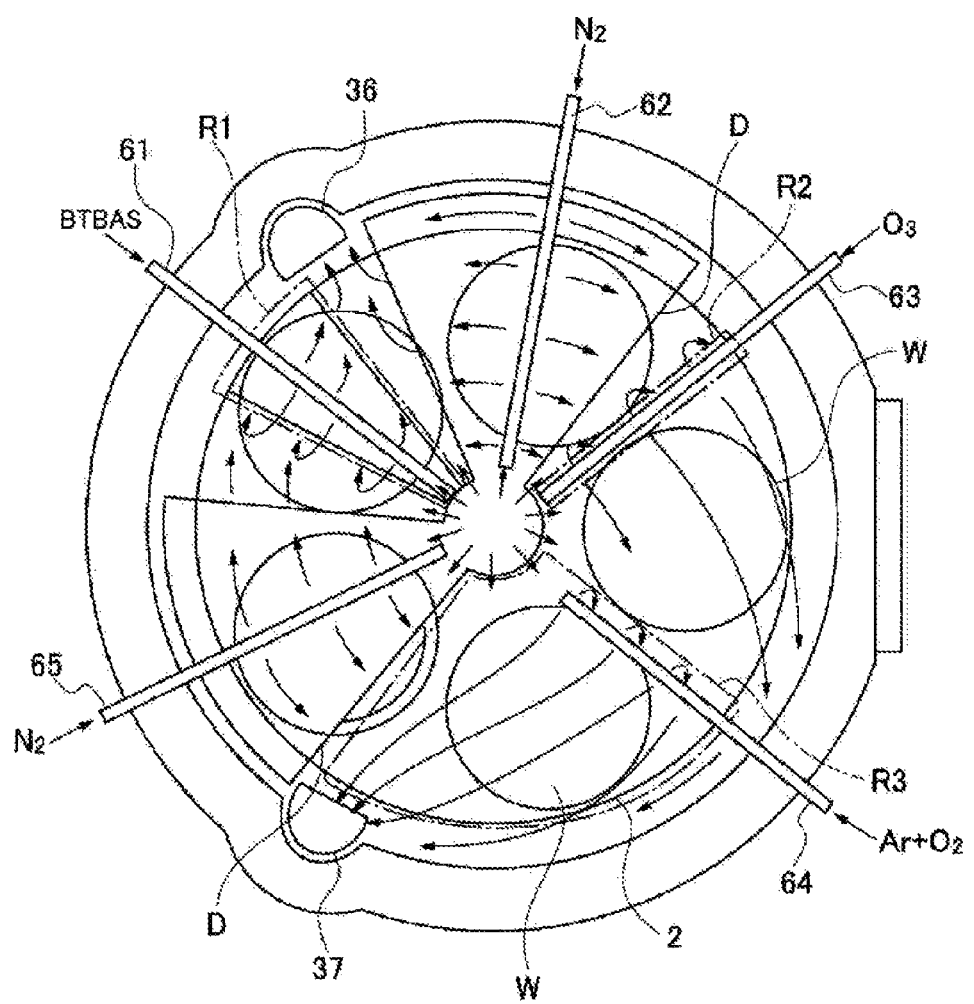
FIG. 12 is a diagram showing a flow of a gas over the rotation table during a film forming process.

A flow of each of the gases supplied to the rotation table 2 is indicated by an arrow in FIG. 12. Since the division region D, to which the $N_2$ gas is supplied, is formed between the adsorption region R1 and the oxidation region R2, the source gas supplied to the adsorption region R1 is not mixed with the oxidation gas supplied to the oxidation region R2 over the rotation table 2, and is exhausted together with the $N_2$ gas through the exhaust hole 36. In addition, since the division region D, to which the $N_2$ gas is supplied, is also formed between the adsorption region R1 and the plasma forming region R3, the source gas, the plasma generation gas supplied to the plasma forming region R3, and the oxidation gas heading for the division region D from an upstream side of the rotation direction of the plasma forming region R3 are not mixed with one another over the rotation table 2, and are exhausted together with the $N_2$ gas through the exhaust hole 37. The $N_2$ gas supplied from the center region forming portion C is also exhausted from the exhaust holes 36 and 37.

Figure 13:
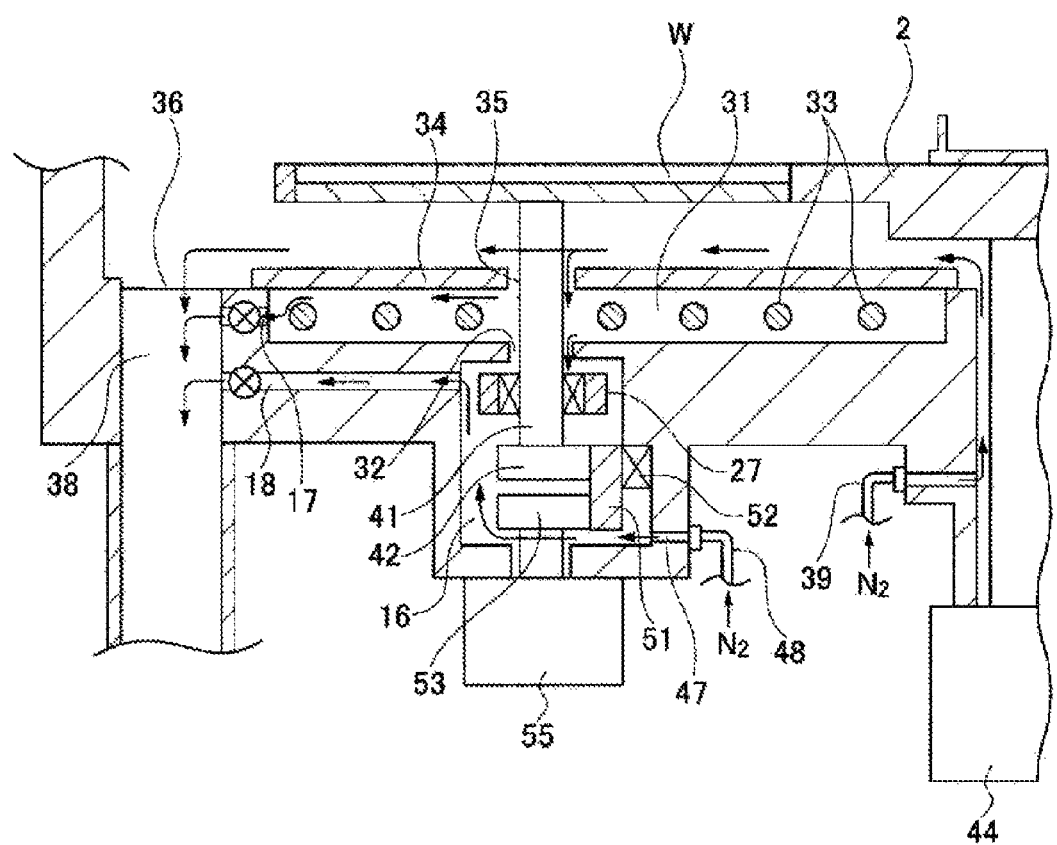
FIG. 13 is a diagram showing a flow of a gas under the rotation table during a film forming process.

In FIG. 13, a flow of the $N_2$ gas supplied from the gas supply tube 39 to the lower side of the rotation table 2 is indicated by arrows. A portion of the $N_2$ gas flows into the exhaust holes 36 and 37 along the rear surface of the rotation table 2 and is removed together with each of the gases flowing from the front surface of the rotation table 2. In addition, in FIG. 13, the $N_2$ gas flowing into the exhaust hole 36 of the exhaust holes 36 and 37 is only indicated. Another portion of the $N_2$ gas flows into the recess portion 31 through the gap between the rotation shaft 41 and the sidewall of the slit 35 of the shield 34, and a portion of the $N_2$ gas flowing into the recess portion 31 flows into the ring-shaped space 16 through the gap between the rotation shaft 41 and the sidewall of the slit 35. The $N_2$ gas flowing into the recess portion 31 and the ring-shaped space 16 flows into the exhaust path 38 through the flow paths 17 and 18 and is removed. Further, in FIG. 13, a flow of the $N_2$ gas supplied from the gas supply tube 48 is also indicated by arrows. The $N_2$ gas is supplied into the ring-shaped space 16 and flows into the exhaust path 38 through the flow path 18 together with the gas supplied from gas supply tube 39. As such, the ring-shaped space 16 is purged by the $N_2$ gases supplied from gas supply tubes 39, 48.

After supply and exhaust of each of the gases are performed as described above, while rotating, the wafers W1 to W5 are sequentially and repeatedly moved to the adsorption region R1 under the nozzle cover 60 of the source gas nozzle 61, the oxidation region R2 under the oxidation gas nozzle 63, and the plasma forming region R3 under the plasma forming part 71. The BTBAS gas discharged from the source gas nozzle 61 is adsorbed onto the wafer W in the adsorption region R1, and the adsorbed BTBAS gas is oxidized by the $O_3$ gas supplied from the oxidation gas nozzle 63 in the oxidation region R2, thereby forming one or more molecular layers of silicon oxide. In the plasma forming region R3, the molecular layer of silicon oxide is exposed to plasma and reformed.

Figure 10:
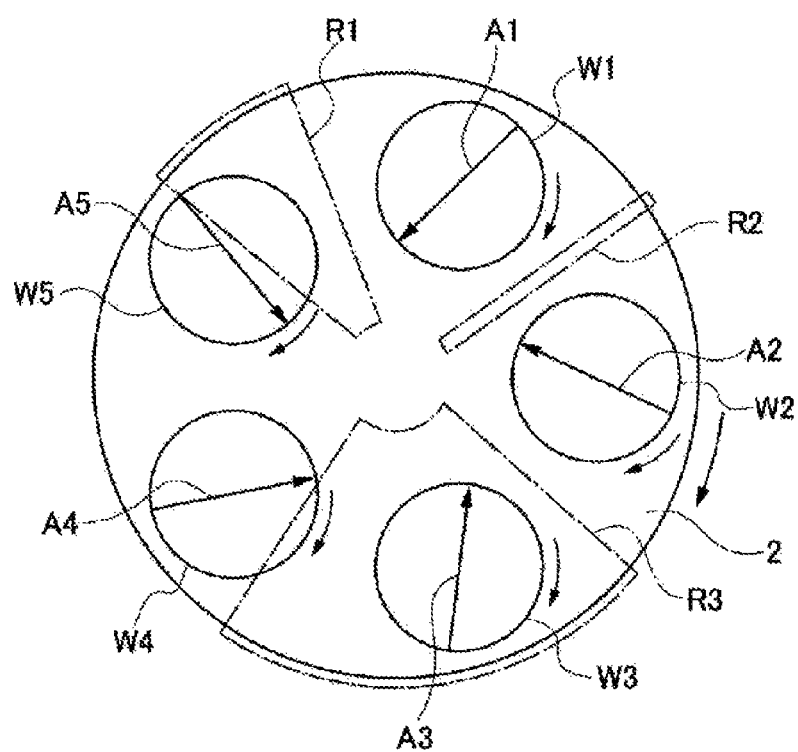
Figure 11:
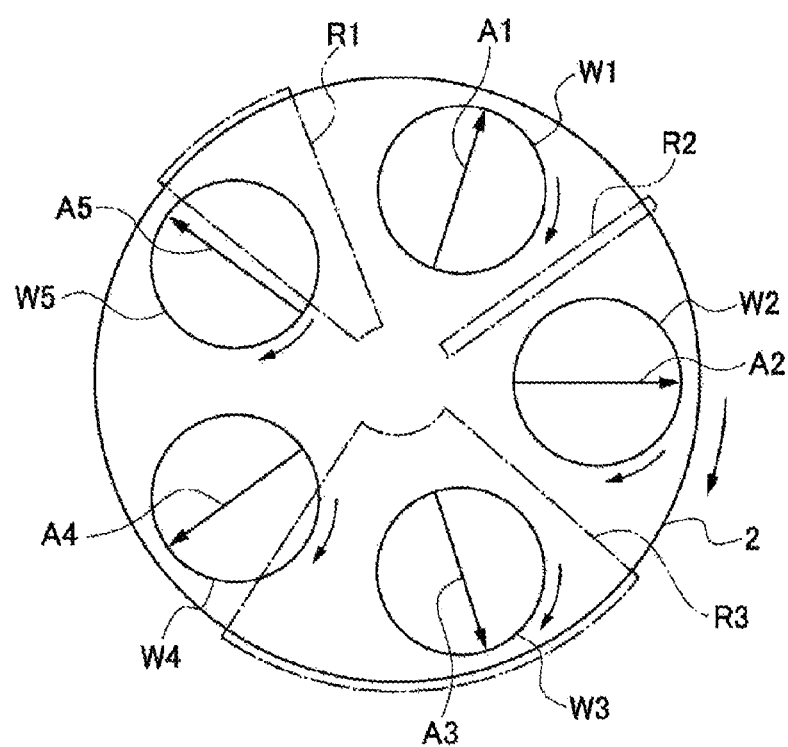

As described above, the loading portion 22 of the wafer W is rotated without synchronization with the rotation of the rotation table 2, and each of the wafers W1 to W5 is positioned in a different orientation whenever placed at a predetermined location of the adsorption region R1. FIG. 10 shows that the rotation table 2 is rotated once after the film formation process is started, and FIG. 11 shows, for example, that the wafers W1 to W5 face orientations rotated 180 degrees from the orientations thereof at the start of the film formation process after the rotation table 2 is continuously further rotated. As the orientations of the wafers W1 to W5 are changed, each of portions of the wafer W in the circumferential direction thereof passes a different position in the adsorption region R1. Thus, even though there is a deviation in concentration distribution of the source gas at each of the locations in the adsorption region R1, an amount of the source gas adsorbed onto the wafer W from the start to the end of the film formation process can be aligned on the respective portions of the wafer W in the circumferential direction thereof. As a result, the thickness of the silicon oxide layer formed on the wafer W can be suppressed from being unequally distributed on the respective portions of the wafer W in the circumferential direction.

Figure 8:
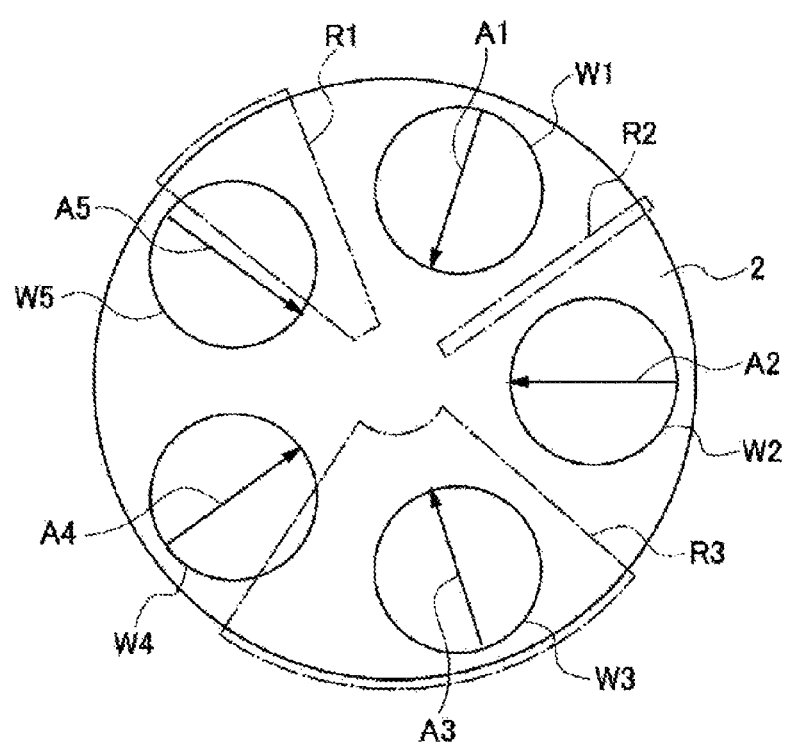
FIGS. 8 to 11 are diagrams showing a location and orientation of a wafer upon a film forming process.

As the rotation of the rotation table 2 continues in the above manner, the molecular layers of the silicon oxide are sequentially stacked, so that a silicon oxide film is formed and the thickness of the silicon oxide film is gradually increased. If the rotation table 2 is rotated a predetermined number of times, revolution and rotation of the wafer W are stopped, so that the film formation process ends. For example, when the film formation process is completed, each of the wafers W1 to W5 faces the same orientation as that at the time of starting the film formation process. That is, the wafers W1 to W5 are rotated an integer number of times from a time of starting the film formation process. A reason for setting the number of rotations as an integer is to further improve uniformity of film thickness in the circumferential direction of the wafer. In addition, for example, when the film formation process is completed, each of the wafers W1 to W5 is positioned at the same location as that at a time of starting the film formation process. Thus, each of the wafers W1 to W5 is disposed at a location and an orientation as shown in FIG. 8. Further, when the film formation process is completed, supply of each of the gases from the gas nozzles 61 to 65 and formation of plasma are also stopped. After the film formation process is completed, the wafers W1 to W5 are unloaded from the vacuum chamber 11 by the transfer mechanism.

According to the film forming apparatus 1, the plural planetary gears 42 are rotated by rotating the first gear 51 by the rotation driver 55, and the loading portion 22 connected to each of the planetary gears 42 through the rotation shaft 41 is rotated, thereby rotating the revolving wafer W. As such, since the orientation of the wafer W can be changed by rotation of the wafer W whenever the wafer W is placed in the adsorption region R1, uniformity of the thickness of the $SiO_2$ film in the circumferential direction of the wafer W can be improved. In the film forming apparatus 1, the five planetary gears 42 are rotated by rotating the first gear 51, thereby rotating the five wafers W through the rotation shaft 41. That is, since the rotation driver 55 rotating the wafer W is used in common for each of the recess portions 23 of the rotation table 2, there is no need to provide an individual rotation driving part for each of the wafers W and an increase in manufacturing cost of the apparatus can be suppressed.

In addition, the interior of the recess portion 31, which is a division region on the surface of the rotation table 2, and the ring-shaped space 16 are purged by the $N_2$ gas supplied from the gas supply tubes 39 and 48. Since the ring-shaped space 16 is purged, even though particles are generated by engagement between the first gear 51, the planetary gears 42 and the driving gear 53, the particles flow into the exhaust path 38, so that the particles are removed from the interior of the vacuum chamber 11 and are prevented from being attached to the wafer W on the rotation table 2. Further, since the inside of the recess portion 31 is purged, the source gas and the oxidation gas are prevented from being attached to the heater 33, thereby preventing deterioration of the heater 33.

In the film forming apparatus 1, the rotation shaft 41 is supported by the ring member 27, which is supported to be suspended from the rotation table 2 by the support 26. In addition, the heater 33 is disposed at each of inner and outer sides of a moving path of the support 26 and the rotation shaft 41 due to rotation of the rotation table 2. With this structure, the heater 33 can heat the wafer W via the rotation table 2 without obstruction of movement of the support 26 and the rotation shaft 41 by the heater 33.

According to the embodiment described above, although it is described that the gas nozzle 61 supplies the source gas for ALD, the gas nozzle 61 may supply a film forming gas for performing film formation by chemical vapor deposition (CVD), and the orientation of the wafer W may be changed by rotation of the wafer W whenever the wafer W is moved to a region to which the film forming gas is supplied. That is, the apparatus may be configured not to include the oxidation gas nozzle or the separation gas nozzle.

Figure 14:
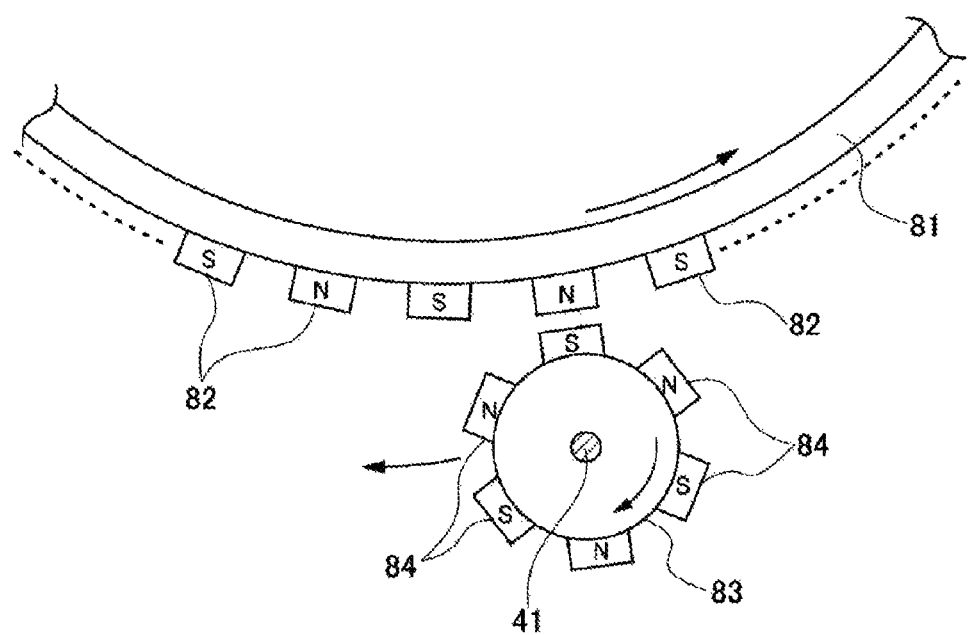
FIG. 14 is a diagram showing another example of configuration of gears.

Configuration of the gears is not limited to the example as set forth above. FIG. 14 shows another configuration example of the first gear, which is a sun gear, and the planetary gear. For a more detailed description of differences with respect to the first gear 51 and the planetary gear 42, the first gear 81 shown in FIG. 14 has a ring shape similar to the first gear 51 (for the sake of convenience, only a cut-out portion of the first gear 81 is indicated in the figure), and a plurality of magnets is disposed on an outer circumference of the first gear 81 in a circumferential direction thereof. In FIG. 14, a magnetic polarity of each of the magnets 82 at an outer end of the gear 81 is indicated and, as for magnetic polarities of the outer end, the magnets 82 are disposed such that a north pole and a south pole are alternately repeated in a circumferential direction of the gear 81.

In addition, like the first gear 81, a planetary gear 83 also includes a plurality of magnets 84 disposed on an outer circumference of the planetary gear 83, and as for magnetic polarities of the outer end, the north pole and the south pole are alternately repeated in a circumferential direction of the gear 83. Further, as the first gear 81 is rotated due to magnetic force between the magnet 82 of the first gear 81 and the magnet 84 of the planetary gear 83, the planetary gear 83 is rotated without contact with the first gear 81, thereby rotating the wafer W. That is, the first gear 81 and the planetary gear 83 are configured with magnetic gears. As such, when the first gear 81 and the planetary gear 83 are configured with magnetic gears, for example, the driving gear 53 rotating the first gear 81 may also be configured with a magnetic gear including magnets disposed on an outer circumference thereof, and may rotate the first gear 81 without contact.

As such, each of the gears is rotated in a contactless manner, so that the particles can be better suppressed from being attached to the wafer W. In addition, in the example of FIG. 14, although both the first and second gears include magnets, since the planetary gear 83 only needs to be rotated by rotation of the first gear 81, either of the magnet 82 and the magnet 84 may be substituted with magnetic substances, such as iron or the like instead of the magnet. Further, the first gear 81 may be configured with a magnetic gear while the driving gear 53 is configured with a magnetic substance.

(Evaluation Test)

Evaluation Test 1 related to the present disclosure will be described in detail. In the descriptions of Evaluation Test 1, for a wafer W loaded in the recess portion 23 of the rotation table 2, the diameter of the wafer W, which was oriented to coincide with a diameter of the rotation table 2 at the time of starting the film forming process, was referred to as a Line Y. Thus, the Line Y corresponds to a line indicated by each of the arrows A1 to A5 in FIG. 8. In addition, the diameter of the wafer W orthogonal to the Line Y is referred to as a Line X.

A test was performed to investigate a change in film thickness distribution due to rotation of the wafer W having a diameter of 300 mm. In Evaluation Test 1-1, a simulation of forming a film without rotation of the wafer W in the film forming apparatus 1 was conducted. In Evaluation Test 1-2, a simulation of forming a film under the same conditions as those in Evaluation Test 1-1 was conducted except that rotation of the wafer W was performed. However, in Evaluation Test 1-2, unlike the embodiments of the present disclosure, the wafer W was set to be rotated only 180 degrees from the start of the film forming process to the end of the film forming process. Further, in Evaluation Test 1-3, a simulation of forming a film under the same conditions as those in Evaluation Test 1-2 was conducted except that the wafer W was set to be rotated only 45 degrees. Furthermore, in Evaluation Test 1-4, a simulation of forming a film under the same conditions as those in Evaluation Tests 1-1 to 1-3 was conducted except that the wafer W was set to be rotated an integer number of times like the embodiments of the present disclosure. For each of the wafers W in Evaluation Tests 1-1 to 1-4, in-plane film thickness distribution of the wafer W was measured.

Figure 15A:
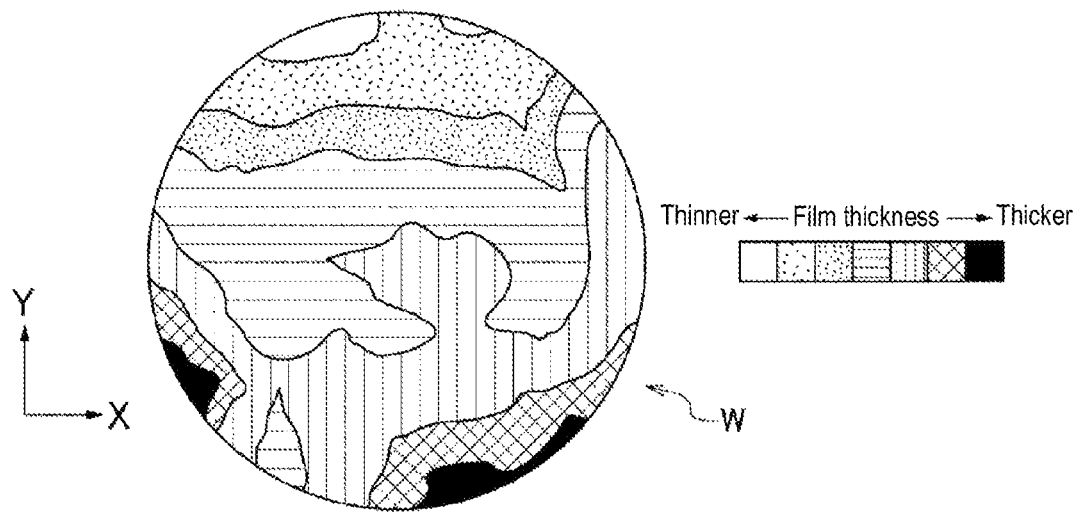
FIGS. 15A and 15B are schematic diagrams showing film thickness distribution of a wafer in an evaluation test.
Figure 15B:
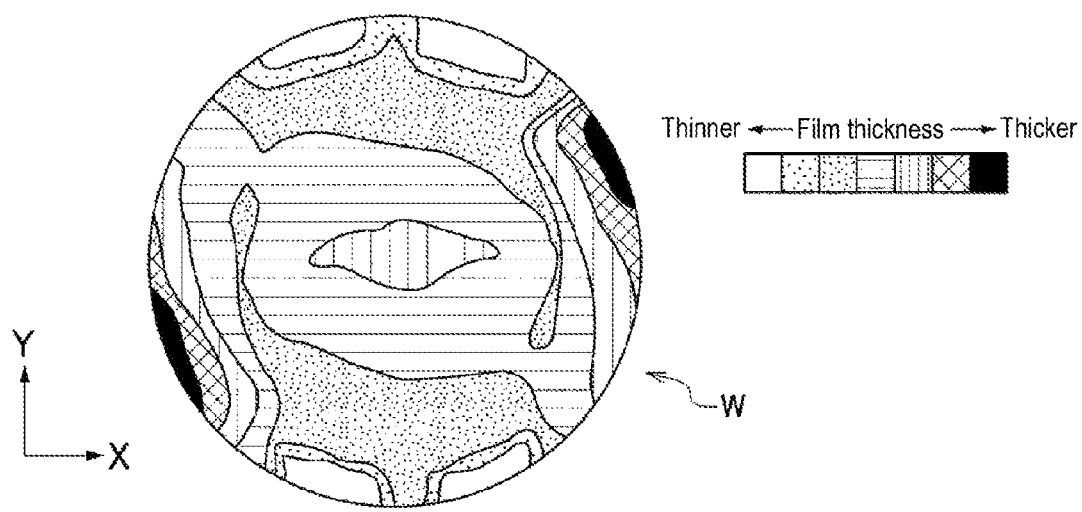
Figure 16A:
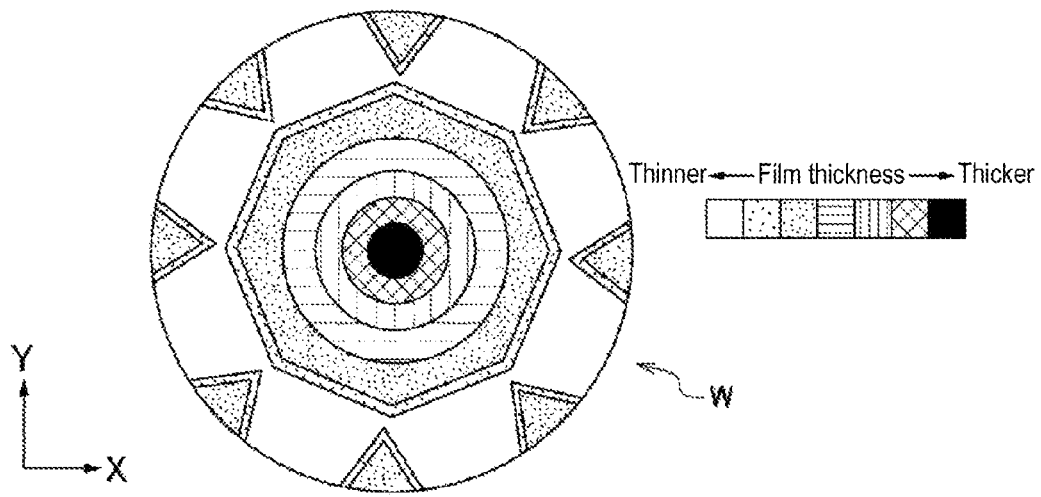
FIGS. 16A and 16B are schematic diagrams showing film thickness distribution of a wafer in an evaluation test.
Figure 16B:
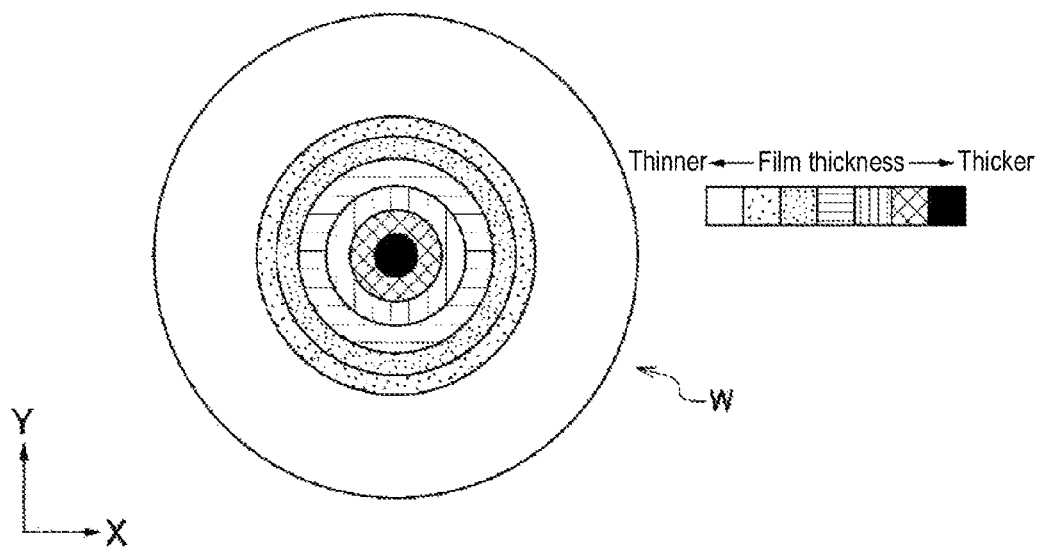

FIGS. 15A and 15B schematically show in-plane film thickness distribution of the wafers W of Evaluation Tests 1-1 and 1-2, respectively. FIGS. 16A and 16B schematically show in-plane film thickness distribution of the wafers W of Evaluation Tests 1-3 and 1-4, respectively. Although actually obtained test results were shown by computer graphics in which colors were provided to a surface of the wafer W based on film thicknesses, FIGS. 15A through 16B show that each region on the surface of the wafer W having a film thickness in a predetermined range is surrounded by a contour line and given a shape, for convenience.

Figure 17A:
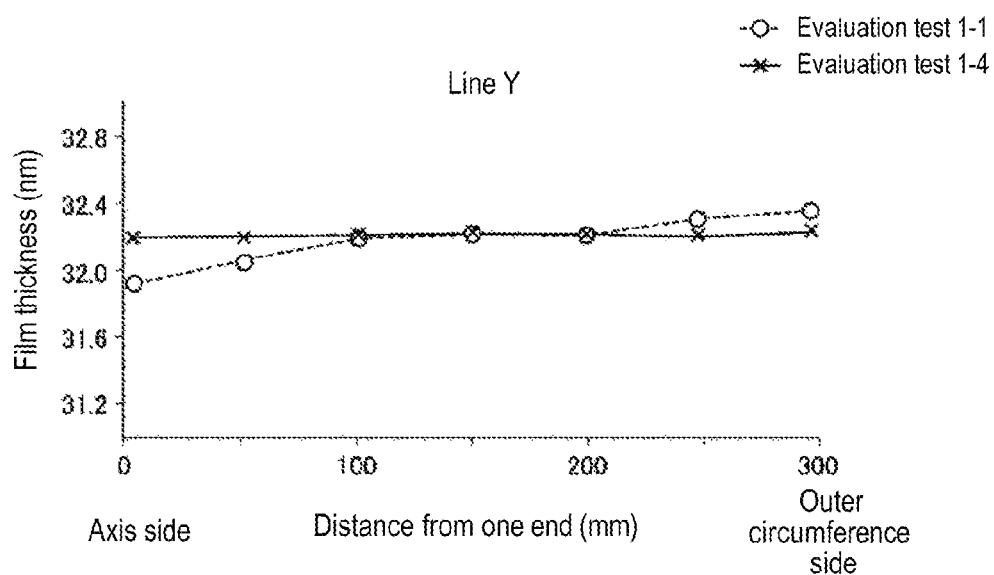
FIGS. 17A and 17B are graphs depicting film thickness distribution of a wafer in an evaluation test.
Figure 17B:
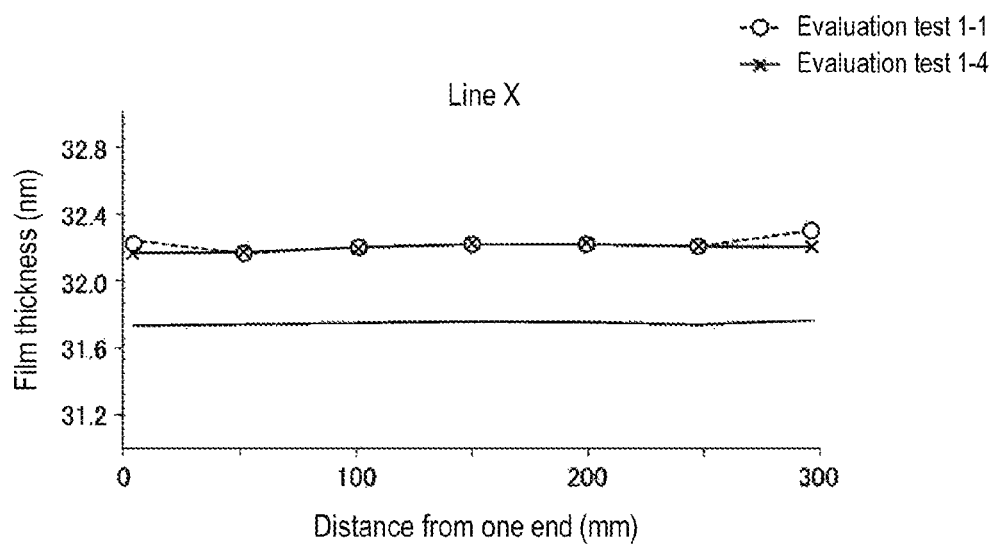
Figure 18A:
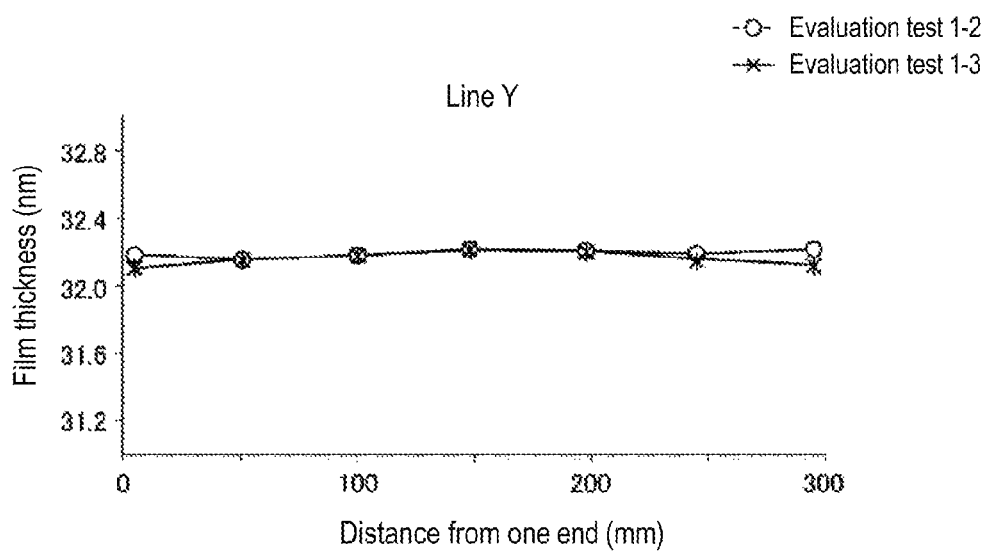
FIGS. 18A and 18B are graphs depicting film thickness distribution of a wafer in an evaluation test.
Figure 18B:
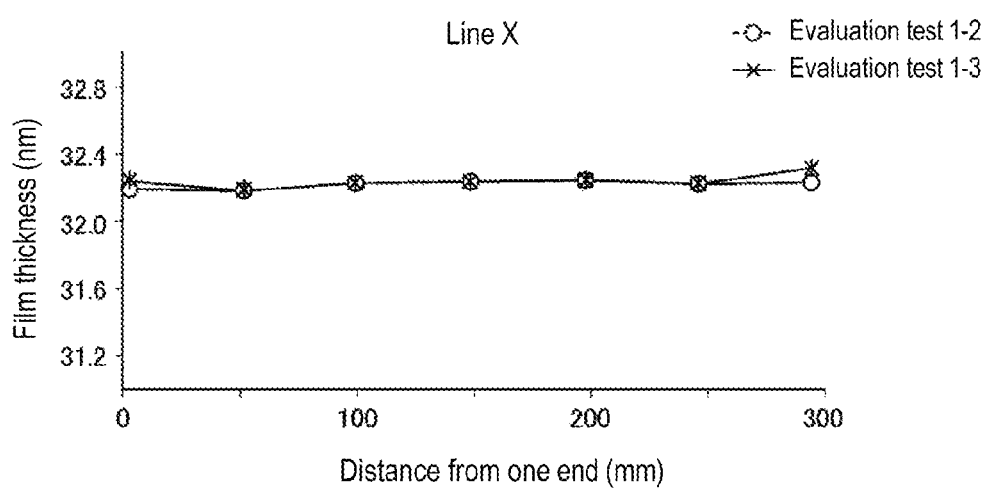

In addition, FIG. 17A shows a graph depicting film thickness distribution of each of Lines Y of Evaluation Tests 1-1 and 1-4, and FIG. 17B shows a graph depicting film thickness distribution of each of Lines X of Evaluation Tests 1-1 and 1-4. A horizontal axis of each of the graphs represents a distance (unit: millimeter) from one end of the wafer W. The one end of the wafer W in the graph of Line Y refers to an end at the center axis side of the rotation table 2. A vertical axis of each of the graphs represents a film thickness (unit: nanometer). FIG. 18A shows a graph depicting film thickness distribution of each of Lines Y of Evaluation Tests 1-2 and 1-3, and FIG. 18B shows a graph depicting film thickness distribution of each of Lines X of Evaluation Tests 1-2 and 1-3.

From the schematic diagrams of the wafers W of FIGS. 15A through 16B, it could be seen that uniformity of film thickness distribution in the circumferential direction of the wafer W was improved by rotating the wafer W, and that uniformity in the circumferential direction in Evaluation Test 1-4, in which the wafer W was rotated an integer number of times, was significantly improved. In addition, from each of the graphs, it is found that film thickness distribution of Lines X did not exhibit a significant difference among Evaluation Tests 1-1 to 1-4. For film thickness distribution of Lines Y, a slight difference in film thickness between the one end and the other end of each Line Y as shown in the graph of Evaluation Test 1-1 was decreased in graphs of Evaluation Tests 1-2 and 1-3, and substantially disappeared in the graph of Evaluation Test 1-4. Therefore, from each of the graphs, it could also be seen that uniformity of film thickness distribution in the circumferential direction of the wafer W was improved.

Further, in each of Evaluation Tests 1-1 to 1-4, an average film thickness, a maximum film thickness, a minimum film thickness, a difference between the maximum and the minimum film thicknesses, and a WinW corresponding to an index of in-plane uniformity, which are calculated from film thicknesses measured at 49 points in a plane of the wafer W, including measurement points on Lines X and Y, are shown in Table 1. The WinW refers to a value obtained by ±{(maximum film thickness-minimum film thickness)/(average film thickness)}/2×100(%), and an absolute value thereof is shown in Table 1. As the absolute value decreases, in-plane uniformity increases. From comparison of values of WinW in Evaluation Tests 1-1 to 1-4, it could be seen that uniformity of film thickness in the overall plane of the wafer W as well as in the circumferential direction was improved, and that Evaluation Test 1-4 showed highest uniformity of film thickness in the overall plane. Therefore, from the results of Evaluation Test 1, it could be seen that rotation of the wafer W, as described in the embodiment of the present disclosure, was effective for improving uniformity of film thickness in the plane of the wafer W, and that rotation of an integer number of times was particularly effective.

TABLE 1

|  | Average (nm) | Maximum (nm) | Minimum (nm) | Maximum − Minimum (nm) | WinW |
| --- | --- | --- | --- | --- | --- |
| Evaluation Test 1-1 | 32.19 | 32.42 | 31.17 | 0.65 | 1.01 |
| Evaluation Test 1-2 | 32.19 | 32.34 | 32.06 | 0.28 | 0.44 |
| Evaluation Test 1-3 | 32.19 | 32.23 | 32.18 | 0.05 | 0.08 |
| Evaluation Test 1-4 | 32.19 | 32.23 | 32.19 | 0.05 | 0.07 |

According to the present disclosure in some embodiments, the film forming apparatus includes a first gear rotating in the rotation direction of the rotation table, a second gear including planetary gears, which are rotated and revolved by rotation of the rotation table and rotates the substrate loaded in the loading portion on one side of the rotation table by rotation, and a rotation driving part rotating the first gear. Since the orientation of the substrate can be changed by rotation of the substrate whenever the substrate is placed in the process gas supply region, uniformity of film thickness in the circumferential direction of the substrate can be improved. In addition, since there is no need to provide the rotation driving part, which includes the motor for rotating the substrate, for each of the loading portions, increase in manufacturing cost of the film forming apparatus can be prevented.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A film forming apparatus that forms a film by supplying a process gas onto a substrate, comprising:
   a vacuum chamber including a ceiling plate, a side wall and a bottom wall;
   a rotation table disposed in the vacuum chamber between the ceiling plate and the bottom wall, and having a loading region formed on an upper surface of the rotation table, the rotation table being configured to revolve the substrate loaded on the loading region;
   a gas nozzle configured to supply the process gas to a gas supply region on the upper surface side of the rotation table to thereby perform film formation on the substrate repeatedly passing through the gas supply region a plurality of times by revolution of the substrate;
   a first gear disposed on a lower surface side of the rotation table and rotated in a rotation direction of the rotation table;
   a driving gear engaging with an outer portion of the first gear;
   a plurality of planetary gears engaging with the first gear, the plurality of planetary gears being disposed to be revolved together with the loading region and configured to rotate the loading region so as to allow the substrate to be rotated;
   a rotation driver configured to rotate the driving gear so as to allow the first gear and the plurality of planetary gears to be rotated; and
   a revolution driver including a motor and configured to rotate the rotation table via a center shaft and the plurality of planetary gears around a central axis of the rotation table so as to allow the substrate to be revolved around the central axis of the rotation table, wherein the center shaft extends vertically downwards from a center portion of the rotation table and is connected to the revolution driver, wherein a clearance is left between the center shaft and the first gear, wherein an annular ring protrusion having a U-shaped cross-section is formed to protrude downward from a lower surface of the bottom wall so as to form a ring-shaped space inside the protrusion, and wherein the first gear, the driving gear and the plurality of planetary gears are disposed in the ring-shaped space, and a gas supply tube configured to supply a gas to the ring-shaped space and an exhaust path configured to evacuate the ring-shaped space are installed in the apparatus.

2. The film forming apparatus of claim 1, further comprising:
- a rotation shaft on which the planetary gear is disposed, the rotation shaft configured to rotate the loading region;
- a bearing configured to support the rotation shaft; and
- a support member supporting the bearing at the rotation table.

3. The film forming apparatus of claim 2, wherein the support member comprises a support disposed to be separated from the rotation shaft in the rotation direction of the rotation table, and a connection part disposed to be separated from the lower surface side of the rotation table and connected to the support and the bearing, and wherein, at an upper side of the connection part, heaters configured to heat the substrate are disposed at each of inner and outer sides of a moving path of the rotation shaft and the support, respectively.

* * * * *